United States Patent [19]

Gagnon

[11] Patent Number: 4,671,835
[45] Date of Patent: Jun. 9, 1987

[54] HANDLING SYSTEM FOR LAMINAR OBJECTS

[75] Inventor: Anthony C. Gagnon, Brighton, England

[73] Assignee: Kulicke and Soffa Industries, INC., Willow Grove, Pa.

[21] Appl. No.: 528,425

[22] Filed: Sep. 1, 1983

[51] Int. Cl.[4] .................. B32B 31/04; B32B 31/18
[52] U.S. Cl. ........................ 156/160; 156/69; 156/108; 156/229; 156/267; 156/494; 156/510; 156/530; 156/569
[58] Field of Search .............. 156/108, 160, 229, 250, 156/261, 267, 494, 510, 514, 518, 521, 530, 569, 69

[56] References Cited

U.S. PATENT DOCUMENTS

| | | | |
|---|---|---|---|
| 2,589,929 | 3/1952 | Dildilian et al. | 156/510 |
| 2,825,194 | 3/1958 | Page | 156/69 |
| 3,457,815 | 7/1969 | Cahill | 156/530 |
| 4,073,671 | 2/1978 | Licata | 156/261 |
| 4,145,239 | 3/1979 | Fujii | 156/229 |
| 4,295,904 | 10/1981 | Schmit | 156/160 |
| 4,317,694 | 3/1982 | Fuchs et al. | 156/521 |
| 4,325,905 | 4/1982 | Takahashi | 156/108 |
| 4,522,679 | 6/1985 | Funakoshi et al. | 156/267 |
| 4,568,414 | 2/1986 | Oldis et al. | 156/494 |

FOREIGN PATENT DOCUMENTS 1163079 8/1968 United Kingdom.

Primary Examiner—Michael Wityshyn
Attorney, Agent, or Firm—John B. Sowell

[57] ABSTRACT

Apparatus for applying adhesive film to an annular frame having a substantially circular disc of uniformly tensioned film adhered to one surface thereof, said film covering the whole of the central aperture of the frame and not extending beyond the outer periphery of the frame at any point, said frame being substantially undamaged by contact with a cutting device used in forming the disc of film.

12 Claims, 1 Drawing Figure

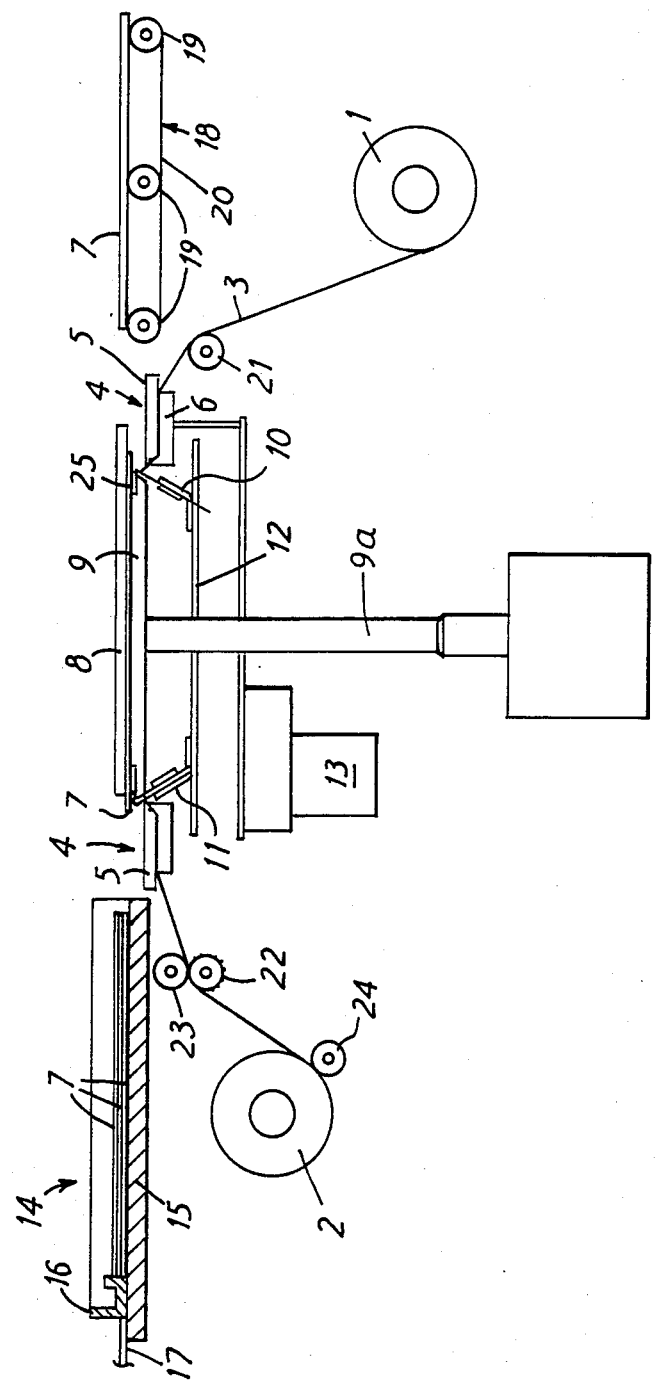

HANDLING SYSTEM FOR LAMINAR OBJECTS

This invention relates to a handling system for laminar objects and, more particularly to a method of, and appparatus for applying adhesive film to an annular frame to allow an object to be mounted within the frame.

Semi-conductor wafers are frequently mounted in this manner both for protection during transportation and so that they may be readily supported as they are cut into individual "chips".

Modern cutting machines for cutting silicon wafers into chips generally employ frames which have an irregular outer periphery to allow indexing and correct location of the frame with its associated wafer and because of the irregular outlines of the frame it is not possible easily to apply the adhesive film to the frame and to get the necessary omnidirectional tension in the film. The irregular outline of the frame means that usually a manual operation of cutting away excess film is necessary and automation of the process is difficult.

This invention provides apparatus for applying adhesive film to an annular frame which comprises means for locating the frame relative to the film to be applied thereto, means for clamping the film relative to the frame so that the film extends parallel to the plane of the frame and is spaced therefrom, and a plunger arranged coaxially of the frame and moveable in a direction perpendicular to the plane of the film and the frame and operating to press the film against the frame while it is clamped in the film clamping means thereby subjecting the film to an omnidirectional tensioning and causing it to adhere to the frame and cutting means for cutting the film while it is under tension.

The frame may have any desired outer and inner configuration but will normally encompass a circular aperture. The outer periphery of the frame may be substantially rectangular, oblong or circular or of any other desired shape to register with a particular apparatus with which the frame is to be used. The cutting means is preferably such that the film applied to the frame is a circular disc of diameter such that it overlaps the aperture in the frame sufficiently to allow good adhesion to the frame without overlapping the outer periphery of the frame and particularly overlapping into indented areas on the outer periphery of the frame.

Although the cutting means may comprise a die punch or the like the cutting means preferably comprises a rotatable cutting blade arranged to cut the film without contacting the surface of the frame, thereby avoiding damage to the frame by the cutting means and, in such case there are preferably additionally provided means for smoothing down the cut edge onto the frame, such means for example comprising a roller or other pressure applying means which follow the cutting means.

The apparatus of the invention may also comprise means for automatically feed the frames to the film applying area, for example from a cassette or other delivery means, such apparatus, for example comprising a reciprocating slide which engages the frame and pushes it into the locating means.

The apparatus also preferably includes means for withdrawing the frames with their applied film. Such means may simply comprise means for accepting a frame ejected from the apparatus by introduction into the locating means of the next frame to be processed or it may comprise means for removing such a frame from the area of the film applying means and, optionally, for loading the film into a cassette where it can be transferred to other processing steps, or even for passing the frame to a position in which other operations are carried out thereon. Such means may, for example, comprise a conveyor or series of conveyors consisting of rubber or like band mounted round the wheels or rollers and running on either side of the apparatus to contact opposed sides of a frame leaving the locating means.

Although it is possible for the apparatus to utilise oversized blanks of film the apparatus preferably includes means for feeding the film from a roll and for taking up excess film, preferably on a further roll. The cutting of discs from a continuous film generates a considerable amount of waste and the cut film collection device is preferably such that the waste is compacted as far as possible to avoid the dimensions of the waste roll becoming too large. Preferably therefore, the draw-off from the cutting position comprises a diabolo shaped roll in conjunction with a cylindrical nip roll and a pressure roll is supplied to ensure that the film wound on the take-up roll is under as much compression as possible. The film clamping means is preferably located at an adjustable distance below the locating means so that the tension on the film may be adjusted to allow the apparatus to accommodate films of different characteristics and different stretchability.

The plunger may be operated from a pneumatic, hydraulic or other system but may also be operated manually, as may also the cutting means and, where applicable the edge smoothing means.

Preferably, in order to avoid blocking the film within the apparatus any parts of the apparatus which come into contact with an adhesive surface of the film are coated with an anti-stick coating such as a silicone coating or a PTFE coating.

The invention also includes a method of producing frames having an applied film which comprises locating a frame with its plane substantially parallel to and spaced from a film to be applied thereto, said film being held in said spaced relationship by clamping means, applying pressure from a plunger against the film to stretch and uniformly tension the film and press it against the frame, thereby adhering the film to the frame, and cutting the film while it is under tension and, if desired smoothing down the cut edges of the film against the frame.

Preferably the cutting operation is carried out with a cutting means that act on a portion of the film that is not in contact with the frame and the cutting means does not contact the frame, therefore avoiding the possibility of damage of the frame.

The apparatus also includes a frame having a substantially circular disc of uniformly tensioned film adhered to one surface thereof, said film covering the whole of the central aperture of the frame and not extending beyond the outer periphery of the frame at any point, said frame being substantially undamaged by contact with a cutting device used in forming the disc of film.

The invention will now be described in greater detail by way of example with reference to the drawing which shows diagrammatically and partly in section one form of apparatus in accordance with the invention.

The apparatus comprises a feed roll 1 and a take-up roll 2 for feeding adhesive film 3 through the apparatus. In its passage through the apparatus the film passes through clamping means 4 comprising an upper plate 5 and a lower plate 6, the upper plate 5 being a stationary plate and the lower plate 6 being moveable to grip the film therebetween. Arranged above the level of the upper plate 5 are provided means (not shown) for locating a frame 7 with its plane substantially parallel to the plane of the film 3. The frame 7 is held, while in the frame locating means by a cover plate 8. A plunger 9 carried on a pneumatic ram 9a operates substantially centrally through the apparatus and coaxially between the clamping means 4 and the central aperture of the frame 7.

Carried on a moveable sub-assembly are a knife 10 and a brush 11 arranged on opposite sides of a rotating disc 12 such that the diameter of the circle described by the knife and the brush is slightly larger than the diameter of the plunger 9.

The moveable gripper plate 6 is driven from a motor 13 as also is the rotatable disc 12.

The apparatus also includes a frame feed mechanism indicated generally by reference numeral 14 and comprising a base plate 15, adjustable frame locaters 16 and a reciprocatable slide 17.

The apparatus also includes means designated generally by the reference numeral 18 for removing frames from the film applying area, said means comprising a plurality of rollers or wheels 19 carrying conveying band 20.

In operation of the apparatus film from the feed roll 1 is passed over tensioning roll 21 between the plates 5 and 6 of the clamping means 4 and then through a nip formed between a soft surfaced roll 22 and a hard surfaced diabolo roll 23 to be taken up on the take-up roll 2. A pressure roll 24 is used to iron the waste film onto the take-up roll 2.

With an apertured frame 7 in position in the frame locating means the moveable plate 6 is brought into contact with the stationary plate 5 to clamp the film therebetween. The plunger 9 then is operated to force the film against the frame 7 against the resistance of the cover plate 8. Pressure pads 25 on the periphery of the plunger ensure that no damage is caused to the film or the frame in this operation.

With the plunger still in position and the film still under tension the rotary disc 12 is advanced to a position in which the knife 10 slits the film where it is stretched in the area between where it leaves the clamping means 4 and it is clamped against the frame 7 by the plunger 9 and on rotation of the disc 12 the knife cuts a circular disc of film. The brush 11 which follows the knife smooths down the cut edge of the film against the frame 7. Means for rotating disc 12, knife 10 and brush 11 after being raised to the cutting position shown by ram 9a in the drawing are not shown, but are within the skill of a mechanization engineer.

The plunger is then withdrawn as also is the knife sub-assembly and the moveable clamping plate 6 and the cover plate 8 is lifted. The slide 17 is then operated to act on the bottom most frame 7 in the frame feed 14 and pushes on the finished frame in the film applying location ejecting it onto the frame removal device 18 whence it can be further treated. The surfaces of the feed rollers, the fixed clamping plate 5, the cover plate 8 and roller 21, all of which come into contact with the adhesive surface of the film 3 are all preferably treated with a non-stick finish to avoid blocking of the film.

Preferably the clamping means 4 is arranged such that its operative level below the plane of the frame 7 can be adjusted so that the tension applied to the film can be adjusted to suit different types of film and/or different applications and/or conditions of applications.

I claim:

1. Apparatus for applying adhesive film to an annular frame which comprises means for locating the frame relative to the film to be applied thereto, means for clamping the film relative to the frame so that the film extends parallel to the plane of the frame and is spaced therefrom,
    a plunger arranged coaxially of the frame and moveable in a direction perpendicular to the plane of the film and the frame and operating to press the film against the frame while it is clamped in the film clamping means thereby subjecting the film to an omnidirectional tensioning and causing it to adhere to the frame,
    cutting means comprising a rotatable blade for cutting the film while it is under tension,
    and smoothing means for pressing the cut edge of the film into engagement with said frame.

2. Apparatus according to claim 1, wherein the frame encompasses a circular aperture, and the cutting means operates to cut a circular disc of film of a diameter such that it overlaps the aperture in the frame sufficiently to allow good adhesion to the frame sufficiently to allow good adhesion to the frame without overlapping the outer periphery of the frame.

3. Apparatus according to claim 1, wherein the cutting means comprises a rotatable cutting knife blade located so as to cut a disc from the film without contacting the surface of the frame, thereby avoiding damage to the frame by the cutting means.

4. Apparatus according to claim 1, wherein the smoothing means comprises pressure applying means which follow a circular path behind the cutting means.

5. Apparatus according to claim 4, wherein the pressure applying means is brush means.

6. Apparatus according to claim 4, which also comprises means for automatically feeding the frames to the film applying area.

7. Apparatus according to claim 6, wherein said feeding means comprises a reciprocating slide which engages the frame and pushes it into the locating means.

8. Apparatus according to claim 6, wherein said feeding means comprises means for feeding said frames from a cassette holding a plurality of the said frames.

9. Apparatus according to claim 6, which further includes withdrawing means comprising at least one conveyor consisting of resilient bands mounted round wheels or rollers and running on either side of the apparatus to contact opposed sides of a frame leaving the locating means.

10. Apparatus according to claim 1, which also includes means for feeding the film from a roll and means for taking up excess film comprising a diabolo shaped roll in conjunction with a cylindrical nip roll and a pressure roll in conjunction with a take-up roll.

11. A method of applying adhesive film to an annular apertured frame which comprises the steps of locating a frame with its plane substantially parallel to and spaced from a film to be applied thereto, said film being held in said spaced relationship by clamping means; applying pressure from a plunger against the film to stretch and uniformly tension the film and press it against the frame, thereby adhering the film to the frame; and cutting the film along a closed circular loop outside the periphery of the plunger while it is under tension; and smoothing down the cut edges of the film against the frame.

12. A method according to claim 11, wherein in the cutting operation the cutting means act on a portion of the film that is not in contact with the frame and the cutting means do not contact the frame, therefore, avoiding the possibility of damage to the frame.

* * * * *